(12) United States Patent
Goss et al.

(10) Patent No.: US 9,858,002 B1
(45) Date of Patent: Jan. 2, 2018

(54) OPEN BLOCK STABILITY SCANNING

(71) Applicant: Seagate Technology LLC, Cupertino, CA (US)

(72) Inventors: Ryan James Goss, Prior Lake, MN (US); Antoine Khoueir, Edina, MN (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 43 days.

(21) Appl. No.: 15/154,501

(22) Filed: May 13, 2016

(51) Int. Cl.
*G06F 3/06* (2006.01)
*G11C 16/34* (2006.01)

(52) U.S. Cl.
CPC ............ *G06F 3/0619* (2013.01); *G06F 3/064* (2013.01); *G06F 3/0653* (2013.01); *G06F 3/0679* (2013.01); *G11C 16/3431* (2013.01)

(58) Field of Classification Search
None
See application file for complete search history.

(56) References Cited

U.S. PATENT DOCUMENTS

| 8,510,595 | B2 | 8/2013 | Walls et al. | |
|---|---|---|---|---|
| 8,526,245 | B2 | 9/2013 | Yoon et al. | |
| 8,909,986 | B2 | 12/2014 | Huang et al. | |
| 8,914,670 | B2 | 12/2014 | Zaltsman et al. | |
| 9,032,271 | B2 | 5/2015 | Sun et al. | |
| 2005/0078506 | A1* | 4/2005 | Rao | G11C 11/4094 365/154 |
| 2013/0054880 | A1 | 2/2013 | Chang et al. | |
| 2015/0100851 | A1 | 4/2015 | Bhalerao et al. | |
| 2016/0019142 | A1 | 1/2016 | Lin et al. | |
| 2016/0124679 | A1* | 5/2016 | Huang | G06F 3/0647 711/103 |
| 2017/0200501 | A1* | 7/2017 | Yang | G11C 16/0483 |

OTHER PUBLICATIONS

Cai et al.,"Read Disturb Errors in MLC NAND Flash Memory:Characterization, Mitigation, and Recovery." Dependable Systems and Networks (DSN), 2015 45th Annual IEEE/IFIP International Conference, IEEE, 2015.

* cited by examiner

*Primary Examiner* — Edward Dudek, Jr.
*Assistant Examiner* — Ralph A Verderamo, III
(74) *Attorney, Agent, or Firm* — Cesari & Reed, LLP; Kirk A. Cesari; Christian W. Best

(57) ABSTRACT

Systems and methods are disclosed for open block stability scanning. When a solid state memory block remains in an open state, where the block is only partially filled with written data, for a prolonged period of time, a circuit may perform a scan on the block to determine the stability of the stored data. When the scan indicates that the data is below a stability threshold, the data may be refreshed by reading the data and writing it to a new location. When the scan indicates that the data is above a stability threshold, the circuit may extend the time period in which the block may remain in the open state.

20 Claims, 4 Drawing Sheets

OPEN BLOCK STABILITY SCANNING

SUMMARY

In certain embodiments, an apparatus may comprise a circuit configured to monitor an amount of time a block of a solid-state memory remains in an open state where the block has not been fully filled with data. In response to reaching an open block time threshold, the circuit may perform a scan on the block to determine a stability value of data in the block, and extend the open block time threshold without refreshing the data when the stability value is above a first stability threshold value.

In certain embodiments, a method may comprise monitoring an amount of time a block of a solid-state memory remains in an open state where the block has not been fully filled with data. In response to reaching an open block time threshold, the method may include performing a scan on the block to determine a stability value of data in the block, and extending the open block time threshold without refreshing the data when the stability value is above a first stability threshold value.

In some embodiments, an apparatus may comprise a nonvolatile solid state memory, and a circuit configured to monitor an amount of time a block of the solid-state memory remains in an open state where the block includes unwritten pages. The circuit may, in response to reaching an open block time threshold, perform a scan on the block to determine a number of errors encountered in data of the block, and extend the open block time threshold without refreshing the data when the number of errors is below a first stability threshold value.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or memory device including instructions that, when executed, cause a processor to perform the methods.

Figure 1:
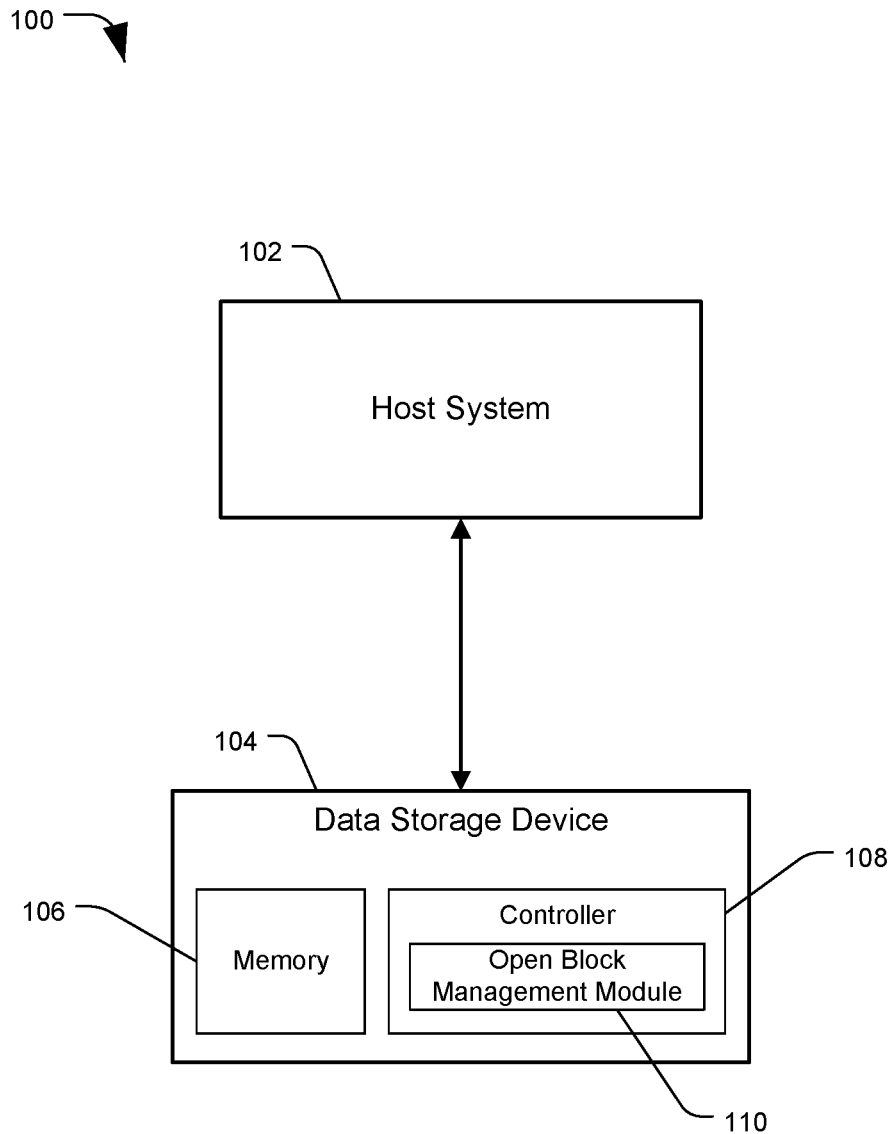
FIG. 1 is a diagram of a system configured to perform open block stability scanning, in accordance with certain embodiments of the present disclosure.

FIG. 1 is a diagram of a system configured to perform open block stability scanning, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a solid state drive (SSD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a controller 108. The DSD 104 may receive a data access request, such as a read or write request, from the host device 102. In response, the DSD 104 may use the controller 108 to perform data access operations on the memory 106 based on the request. The controller 108 may comprise a circuit or processor configured to control operations of the data storage device 104, such as the methods and functions described herein, as well as storing data to or retrieving data from the memory 106. The memory 106 may comprise one or more data storage mediums, such as nonvolatile solid state memories such as Flash memory, magnetic storage media such as disc drives, other types of memory, or a combination thereof.

Some memories 106, such as NAND Flash memory, may include a plurality of storage locations referred to as "blocks," and each block may include a plurality of smaller storage locations referred to as "pages." Some solid state memories are not randomly writable in that data cannot be overwritten or updated, and instead the storage locations must be erased or reset prior to being written with new data. Data may be written (or "programmed") at the page level, but the erasing process may be limited to the block level.

Blocks in a memory may be written a page at a time, for example by starting at a first page and continuing one page at a time until all pages have been written. When some data has been written to a block but not all pages of the block have been filled, the block may be considered to be in an "open" state. Similarly, one or more most recently written pages of a block may be considered "open" pages. If left in an open state for a prolonged period of time, data in an open block may have a chance of developing errors and becoming less reliable. In order to avoid loss of data, the DSD 104 may be configured to perform open block management operations.

DSD 104 may include an open block management module (OBMM) 110. A "module" may include one or more physical components of a computing device (e.g., circuits, processors, etc.), may include instructions that, when executed, can cause a processor to perform a particular task or job, or any combination thereof. A module may be configured to perform a particular task or job. The OBMM 110 may perform the methods and processes described herein to monitor open blocks and perform operations to prevent data loss at open blocks. A more detailed example embodiment of a DSD 104 is described in regards to FIG. 2.

Figure 2:
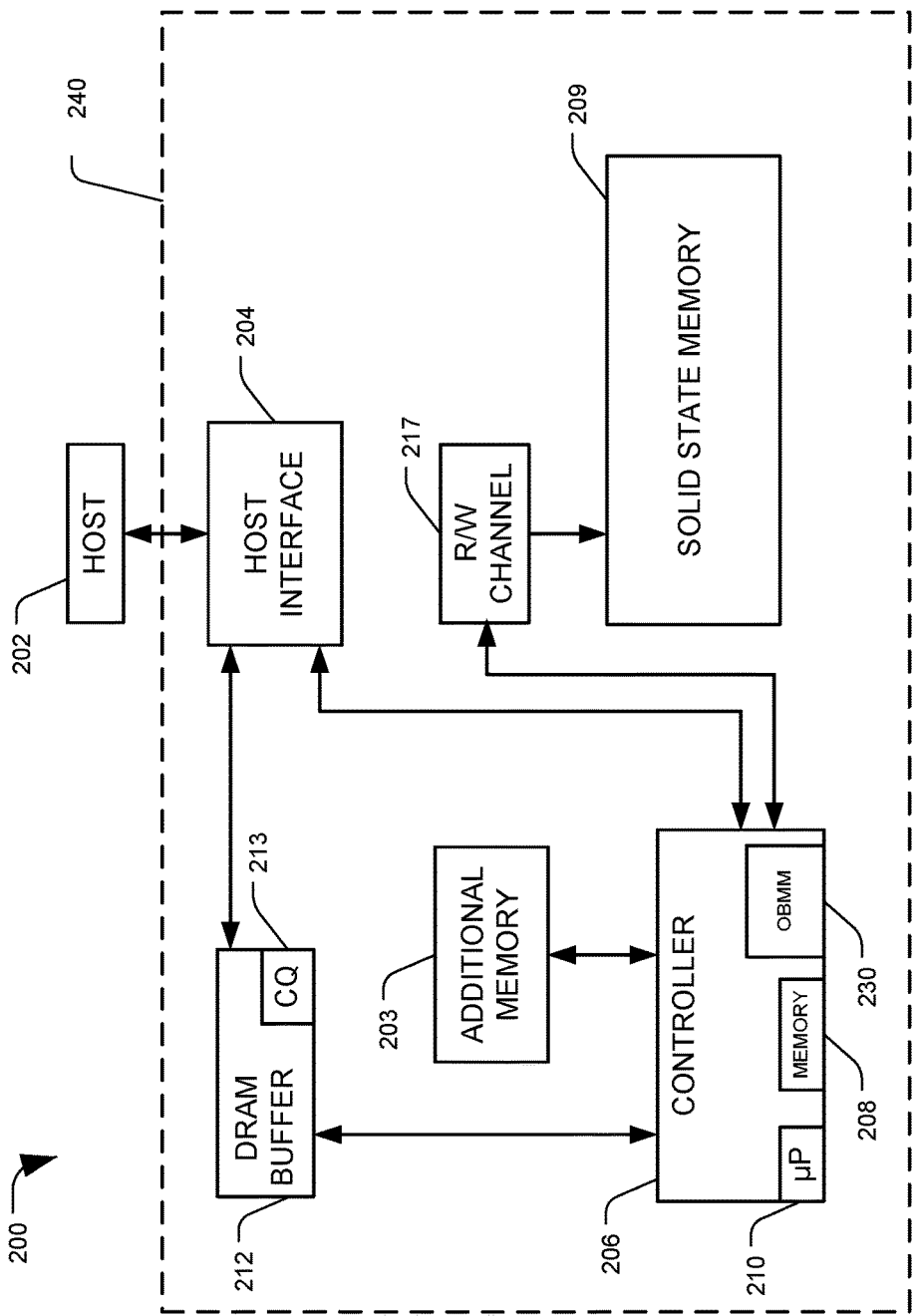
FIG. 2 is a diagram of a system configured to perform open block stability scanning, in accordance with certain embodiments of the present disclosure.

FIG. 2 is a diagram of a system 200 configured to perform open block stability scanning, in accordance with certain embodiments of the present disclosure. Specifically, FIG. 2 provides a functional block diagram of an example data storage device (DSD) 200. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector (not shown) that allows the DSD 200 to be physically removed from the host 202. In some embodiments, the DSD 200 may have a casing 240 or housing containing the components of the DSD 200, or the components of the DSD 200 may be attached to the housing, or a combination thereof. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. In some embodiments, the DSD 200 can include a read-write (R/W) channel 217, which can encode data during write operations and reconstruct user data retrieved from a memory, such as solid state memory 209, during read operations. Solid state memory 209 may include nonvolatile memory, such as NAND Flash memory.

In some embodiments, the DSD 200 may include an additional memory 203 instead of or in addition to solid state memory 209. For example, additional memory 203 can be either volatile memory such as DRAM or SRAM, nonvolatile memory such as magnetic disc(s) or additional nonvolatile solid state memory, or any combination thereof. The additional memory 203 can function as a cache and store recently or frequently read or written data, or data likely to be read soon. Additional memory 203 may also function as main storage instead of or in addition to solid state memory 209. A DSD 200 containing multiple types of nonvolatile storage mediums, such as a disc and Flash, may be referred to as a hybrid storage device.

DSD 200 may include an open block management module (OBMM) 230. The OBMM 110 may perform the methods and processes described herein to monitor open blocks and perform operations to prevent data loss at open blocks. For example, the OBMM 230 may monitor open blocks at solid state memory 209, perform evaluations of the blocks, and then perform reliability enhancing actions to prevent data loss. The OBMM 230 may be part of or execute by the controller 206, may be a separate component or circuit, may be incorporated into other components of the DSD 200, or any combination thereof. Additional details on the solid state memory 209 and OBMM 230 are discussed in regard to FIG. 3.

Figure 3:
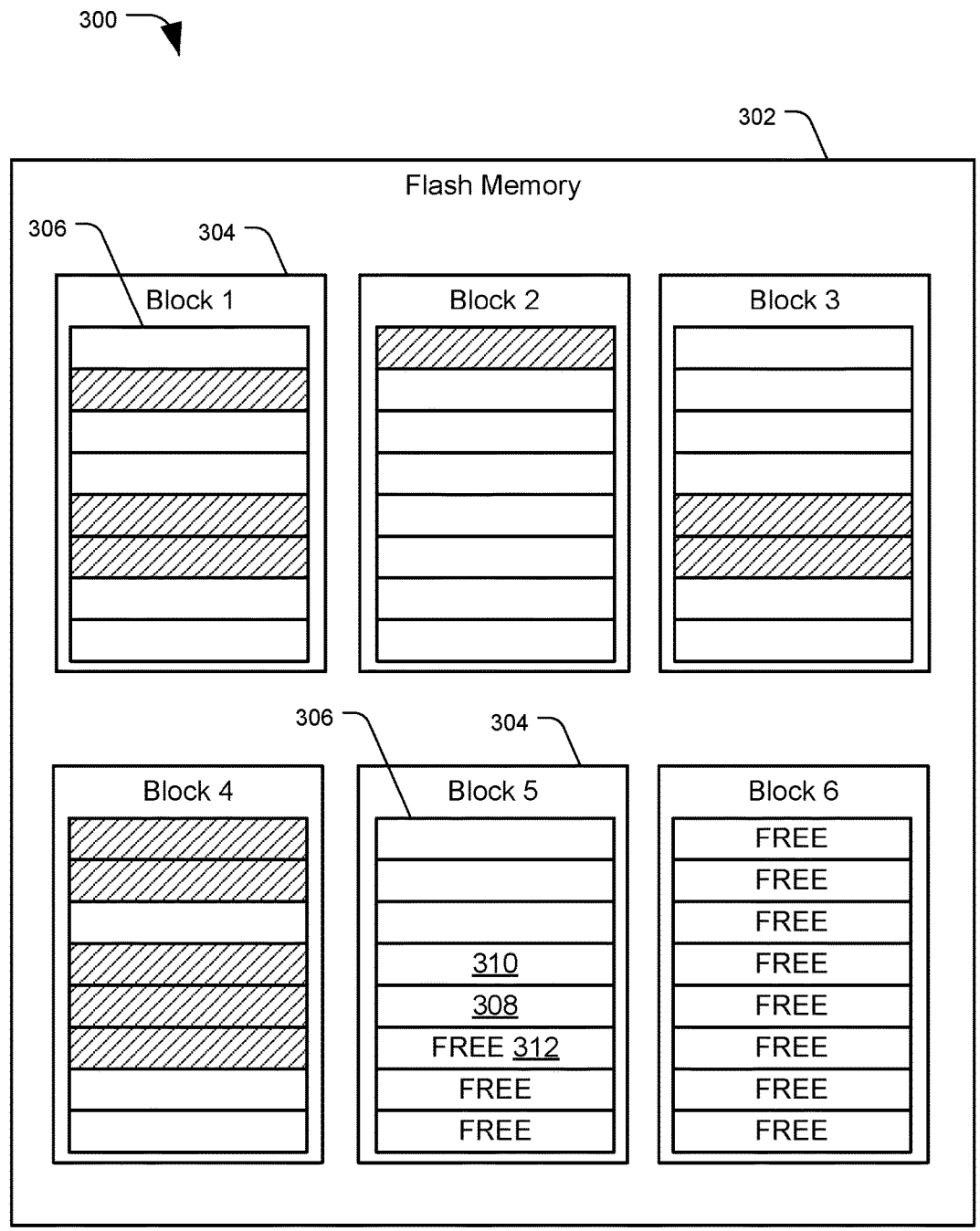
FIG. 3 is a diagram of a system configured to perform open block stability scanning, in accordance with certain embodiments of the present disclosure.

FIG. 3 is a diagram of a system 300 configured to perform open block stability scanning, in accordance with certain embodiments of the present disclosure. System 300 may include a NAND Flash memory 302, although other types of solid state memory are also possible. Flash memory 302 may include a plurality of blocks 304, each of which may include a plurality of writable pages 306 for storing data. Data may be written to Flash memory 302 in page-sized data segments. For example, each page 306 may store 8 KiB (kibibyte) of data, and a block 304 may contain 64 pages, or 128 pages. A portion of each page may be devoted to error correction code (ECC) checksum values or other error correction or parity data. The size of pages and blocks, and the number of pages per block may be different depending on the device. Pages containing invalid data (e.g. no longer valid due to a more recent copy of the data being stored elsewhere) are indicated in FIG. 3 by hashed lines. Pages that have not yet been written are indicated as "free."

As stated, data may be written to Flash memory 302 one page 306 at a time, but already written data may not be overwritten with new data. If data stored in a specific page 306 is updated (e.g. written to a new location), the data for that page becomes invalid. Once all the pages 306 in a block 304 have been filled with valid or invalid data, a garbage collection process may be performed to recapture that space and allow new data to be written to the block 304. In garbage collection, all valid data is read from a block 304 and written to new pages 306 in other blocks 304. Once all valid data has been removed from a block 304, the entire block 304 may be erased and made available for new data. Data may be written one page at a time, but only an entire block may be erased at a time.

For example, Block 4 may be selected for garbage collection, because it has the most invalid pages. The three valid pages may be read, and may be copied to the three free pages of Block 5. Block 4 may therefore no longer have any valid data, and all pages 306 in Block 4 may be erased and made free for new data.

When only a portion of the pages 306 of a block 304 have been written, as shown in Block 5, that block may be considered to be in an open state. Once all pages 306 of a block 304 have been written with data (whether valid or invalid), the block 306 may be put in a closed state, as in Block 1 through Block 4. Closing a block 306 may include refining and stabilizing threshold voltage values. When a block has not been closed, coupling effects between written pages and unwritten free pages may result in a degradation of data quality in pages of the open block. Remaining in an open state for a prolonged period may lead to data corruption and errors in the stored data, and eventually may lead to unrecoverable data.

As used herein, an open page may be a last-written page in an open block. Similarly, reference may be made to open word lines, with word lines and bit lines being used to store data to certain solid state memories. For example, page 308 may be the last-written page of Block 5, and adjacent to a first free page 312. Open pages 308 and other pages 310 close to free pages may be most susceptible to data errors from being in an open block. For example, the closer a page 306 is to an unwritten free page 312, the more likely the page 306 is to experience data quality degradation.

In order to prevent data degradation or loss at open blocks 304 and pages 306, an open block management module (OBMM) may perform operations to monitor and manage open blocks and pages. The OBMM may be configured to monitor an amount of time blocks remain in an open state, performing data maintenance of data in open blocks, and other operations as disclosed herein. An example method of performing open block management operations is described in regard to FIG. 4.

Figure 4:
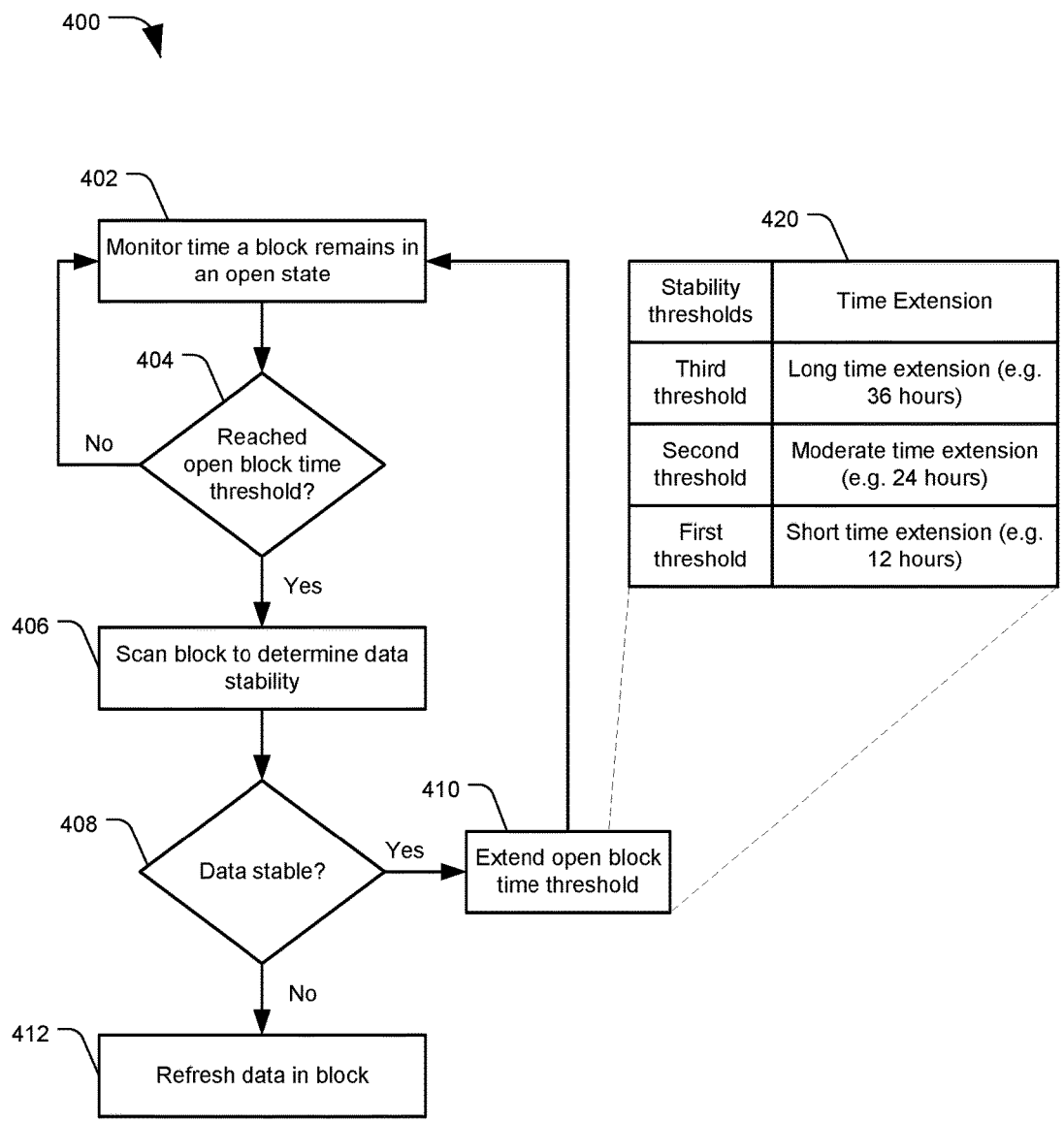
FIG. 4 is a flowchart of a method of open block stability scanning, in accordance with certain embodiments of the present disclosure.

FIG. 4 is a flowchart of an example method 400 of open block stability scanning, in accordance with certain embodiments of the present disclosure. The method 400 may be performed by an open block management module (OBMM) as described herein.

The method 400 may include monitoring an amount of time a selected block remains in an open state, at 402. Blocks may remain reliable for a certain period of time while in an open state. The OBMM may therefore compare an amount of time that a block has been in an open state against an open block time threshold. The open block time threshold may be a value that can indicate when data may become less reliable in an open block. The time threshold may be set by a manufacturer of a data storage device (DSD) or the OBMM, for example based on reliability testing performed on similar memories. The time threshold may also be varied by the OBMM, for example based on a measured temperature or other conditions. The method 400 may include determining whether the open block time threshold has been reached for the selected block, at 404. If not, the method 400 may include continuing to monitor the selected block at 402.

When the selected block has reached the open block time threshold, at 404, the OBMM may perform operations to prevent data loss and enhance reliability. For example, the OBMM may simply refresh the data in the selected block when the time threshold is reached, by reading data from the selected block, correcting any data errors that have been detected, and copying the data to a new location. For example, the data may be programmed to a new block, or back into free pages of the selected block. The newly written data will not include any degradation yet, and if the target block is still open, a new open block time threshold may be monitored for the data. In this manner, the data that was read from the selected block during the refresh becomes invalid data, because a newer version of the data is recorded elsewhere. Loss of the invalid data is no longer a concern.

However, an open block time threshold may be set based on a worst-case scenario, so that even the least reliable blocks in the memory should not lose data prior to the time threshold. The amount of time for which a block may reliably retain data while in an open state may vary based on various factors, such as temperature, physical characteristics of the memory cells, wear on the block, or other factors. For example, some pages may be more resistant to data corruption due to being in an open state than other blocks. Because solid state memory cells may have a limited lifespan in how many program/erase (PE) cycles the cells can endure, and the operational overhead in performing data refreshes on open blocks, it may improve device performance to only perform data refreshes when those refreshes are necessary to preserve data integrity.

Accordingly, when the open block time threshold has been reached at 404, the method 400 may include scanning the selected block to determine data stability, at 406. Scanning the block may include reading data from pages of the block, and observing certain parameters such as an error rate (e.g. a bit error rate BER), a read retry rate, other parameters that may indicate data degradation, or any combination thereof. The scan may be performed by reading all pages from the block, or may be performed by reading selected pages, such as a last "N" pages of the block, where N is an integer value less than the number of pages in the block. The last N pages may represent a number of most-recently-written pages in the block that may be most susceptible to open block data degradation. The selected number of pages N may be a preset number of pages to read during a scan, with the OBMM configured to read all written pages in the selected block if there are less than N written pages, or to read N pages if there are N or more written pages.

The scanned data or the block may be assigned a stability value based on the observed parameters. The stability value may then be compared against one or more stability threshold values to determine whether and how stable the data in the block is. If the stability value exceeds a stability threshold, it may indicate that the data is stable and may not need immediate refreshing. Conversely, if the observed parameters indicate a stability value that does not exceed a stability threshold, it may indicate that the data is not stable and should be refreshed. The stability threshold may be calculated based on other stored information (e.g. an ECC capability of the drive) or the threshold itself may be stored to a memory accessible to the OBMM, such as DRAM.

The stability value for the data may be derived from the observed parameters, e.g. so that parameters indicating few errors or little data degradation results in a high stability value. The OBMM may determine the stability value based on whether certain events occur. For example, if error correction code (ECC) correction fails on a first read of the data, it may indicate that the data is not stable and the OBMM may assign a low stability value.

Optionally, the observed parameters may be used as the stability value itself. For example, a number of errors encountered may be evaluated compared to a stability threshold based on an ECC capability of the drive. If the ECC capability of a device allows for the correction of X errors encountered within a certain amount of bits, then detecting a number of errors that is, e.g. over 80% of the value of X within that certain amount of bits may indicate that the data is not stable. Other stability metrics may include an iteration count for a LDPC (low-density parity check)-ECC decoder to correct read data. Other error recovery information, such as whether RAID recovery is initiated, may also be used to measure stability.

The OBMM may obtain the parameter information directly, e.g. by receiving a read signal and extracting the parameter information from the signal. The OBMM may also obtain the parameter information from other components. For example, if the parameter information includes a number of erroneous bits, the OBMM may obtain the number of error bits from an ECC decoder component of a read channel.

Based on the types of stability values used, a determination of stability may be based on whether the stability value is higher than a threshold or lower than a threshold. For example, if the stability value is a number of errors encounters, being above a threshold value may indicate that the data is not stable. Alternately, if a stability value is used where a high value indicates stable data and a low value indicates unstable data, being above a threshold may indicate that the data is stable.

The method 400 may include determining whether the data is stable as described, at 408. If the data is not stable, the method 400 may include refreshing the data in the selected block, at 412. The data may be read from the selected block and copied to a new storage location. The new storage location may include free pages of the selected block, to pages in a different block, or a combination thereof.

If the data is stable, at 408, the method 400 may include extending the open block time threshold for the selected block, at 410. For example, if the initial open block time threshold is 24 hours, the selected block may have its time threshold reset to 24 hours again. Optionally, a time threshold that is longer or shorter than the initial time threshold may be applied; e.g. 12 hours instead of 24 hours. The amount of additional time allotted for the extended time threshold may be based on the stability value determined for the selected block. In some embodiments, the closer the stability value was to indicating that the data is not stable (e.g. the closer the stability value was to being below a stability threshold), the less additional time may be added to the open block time threshold. For example, if the number of errors encountered was 50% of the number of correctable errors, 50% of the initial time threshold may be added for the block (e.g. 12 hours from an initial 24 hour time threshold). In another example if the stability value was 80% higher than the stability threshold, 80% of an initial or default time threshold may be added to the extended open block time threshold. The OBMM may also compare the detected stability parameters or stability value against a plurality if tiered stability thresholds, with the amount of time the open block time threshold is extended depending on which stability thresholds were exceeded. An example decision table 420 is depicted for the time extension determination performed at 410. According to decision table 420, if the parameters only exceeded a first low stability threshold, a small amount of additional time may be added (e.g. 12 hours). If a second stability threshold is exceeded, a moderate time extension (e.g. 24 hours) may be applied. If the parameters exceeded all stability thresholds, indicating very stable data, a much longer open block time threshold may be applied (e.g. 36 hours). The extended time threshold may be modified by other factors, such as a measured temperature. Once the open block time threshold has been extended at 410, the method 400 may then continue to monitor the time the selected block remains in an open state, at 402.

By applying the method 400, the number of data refreshes required and wear at a memory device may be reduced, thereby improving the memory's useful life. In addition, the overhead of performing data refreshes may be reduced, thereby improving device performance and responsiveness.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a circuit configured to:
monitor an amount of time a block of a solid-state memory remains in an open state where the block has not been fully filled with data;
in response to reaching an open block time threshold:
perform a scan on the block to determine a stability value of data in the block; and
extend the open block time threshold without refreshing the data when the stability value indicates that the data is stable.

2. The apparatus of claim 1 further comprising:
the scan includes:
read the data from the block;
detect a number of errors in the data;
determine the stability value based on the number of errors; and
the circuit is configured to extend the open block time threshold without refreshing the data when the stability value is above a first stability threshold value.

3. The apparatus of claim 2 further comprising reading data from the block for the scan includes reading N most recently written pages from the block, where N is an integer value less than a number of pages in the block.

4. The apparatus of claim 2 comprising the circuit further configured to refresh the data when the stability value is below the first stability threshold value, including:
read the data from the block; and
write the data to a new location.

5. The apparatus of claim 4 comprising the circuit further configured to extend the open block time threshold by a variable amount based on how close the stability value is to the first stability threshold value.

6. The apparatus of claim 4 comprising the circuit further configured to:
compare the stability value to a plurality of tiered stability thresholds including the first stability threshold value; and
extend the open block time threshold by different amounts based on which of the tiered stability thresholds the stability value exceeds.

7. The apparatus of claim 1 further comprising:
the scan includes:
read the data from the block;
determine whether error correction failed on a first read attempt; and
determine the stability value to indicate the data is not stable when the error correction failed on the first read attempt.

8. A method comprising:
monitoring an amount of time a block of a solid-state memory remains in an open state where the block has not been fully filled with data;
in response to reaching an open block time threshold:
performing a scan on the block to determine a stability value of data in the block; and
extending the open block time threshold without refreshing the data when the stability value is above a first stability threshold value.

9. The method of claim 8 further comprising:
the scan includes:
reading the data from the block;
detecting a number of errors in the data;
comparing the number of errors to an error correction code capability; and
determining the stability value based on the comparison.

10. The method of claim 9 further comprising reading data from the block for the scan includes reading N most recently written pages from the block, where N is an integer value less than a number of pages in the block.

11. The method of claim 8 further comprising:
   the scan includes:
      reading the data from the block;
      detecting a read retry rate required to read the data; and
      determining the stability value based on read retry rate.

12. The method of claim 8 further comprising:
   refreshing the data when the stability value is below the first stability threshold value, including:
      reading the data from the block; and
      writing the data to a new location.

13. The method of claim 8 further comprising:
   extending the open block time threshold by a variable amount based on how close the stability value is to the first stability threshold value.

14. The method of claim 8 further comprising:
   comparing the stability value to a plurality of tiered stability thresholds including the first stability threshold value; and
   extending the open block time threshold by different amounts based on which of the tiered stability thresholds the stability value exceeds.

15. An apparatus comprising:
   a nonvolatile solid state memory;
   a circuit configured to:
      monitor an amount of time a block of the solid-state memory remains in an open state where the block includes unwritten pages;
      in response to reaching an open block time threshold:
         perform a scan on the block to determine a number of errors encountered in data of the block; and
         extend the open block time threshold without refreshing the data when the number of errors is below a first stability threshold value.

16. The apparatus of claim 15 further comprising reading data from the block for the scan includes reading N most recently written pages from the block, where N is an integer value less than a number of pages in the block.

17. The apparatus of claim 15 comprising the circuit further configured to refresh the data when the number of errors is above the first stability threshold value, including:
   read the data from the block; and
   write the data to a new location, including to free pages of the block.

18. The apparatus of claim 15 comprising the circuit further configured to extend the open block time threshold by a variable amount based on how close the number of errors is to the first stability threshold value.

19. The apparatus of claim 15 comprising the circuit further configured to:
   extend the open block time threshold by a first amount when the is below the first stability threshold value; and
   extend the open block time by a second amount longer than the first amount when the number of errors is below a second stability threshold value.

20. The apparatus of claim 15 further comprising the first stability threshold value is based on an error correction code (ECC) capability of the apparatus.

* * * * *